(12) United States Patent
Yamada et al.

(10) Patent No.: US 8,580,066 B2
(45) Date of Patent: Nov. 12, 2013

(54) METHOD FOR MANUFACTURING MULTILAYER WIRING SUBSTRATE

(75) Inventors: Erina Yamada, Komaki (JP); Hironori Sato, Kasugai (JP)

(73) Assignee: NGK Spark Plug Co., Ltd, Nagoya (JP)

( * ) Notice: Subject to any disclaimer, the term of this patent is extended or adjusted under 35 U.S.C. 154(b) by 54 days.

(21) Appl. No.: 13/372,088

(22) Filed: Feb. 13, 2012

(65) Prior Publication Data

US 2012/0205039 A1 Aug. 16, 2012

(30) Foreign Application Priority Data

Feb. 15, 2011 (JP) .................................. 2011-30286
Dec. 1, 2011 (JP) ................................ 2011-263275

(51) Int. Cl.
| | |
|---|---|
| B29C 65/52 | (2006.01) |
| B32B 37/02 | (2006.01) |
| B32B 37/12 | (2006.01) |
| B32B 38/10 | (2006.01) |
| B32B 38/04 | (2006.01) |
| B32B 43/00 | (2006.01) |
| C09J 5/00 | (2006.01) |

(52) U.S. Cl.
USPC ........ 156/247; 156/252; 156/289; 156/307.3; 156/307.7

(58) Field of Classification Search
USPC ......... 156/230, 233, 234, 240, 241, 247, 250, 156/252, 289, 307.1, 307.3, 307.7; 174/255, 258, 261, 262; 361/792, 794; 257/737, 778

See application file for complete search history.

(56) References Cited

U.S. PATENT DOCUMENTS

| | | | |
|---|---|---|---|
| 6,534,723 B1 * | 3/2003 | Asai et al. ..................... 174/255 |
| 2001/0035298 A1 * | 11/2001 | Paruchuri ...................... 174/255 |
| 2007/0119619 A1 | 5/2007 | Nakamura et al. | |

FOREIGN PATENT DOCUMENTS

| | | |
|---|---|---|
| JP | 2007-96260 A | 12/2007 |
| JP | 2010-153839 A | 7/2010 |

* cited by examiner

*Primary Examiner* — Sing P Chan
(74) *Attorney, Agent, or Firm* — Stites & Harbison PLLC; Jeffrey A. Haeberlin; Nicolo Davidson (57) ABSTRACT

A method for manufacturing a reliable multilayer wiring substrate at a relatively low cost having little or no warpage or distortion is provided. In certain embodiments an insulation core made of an insulation material that is more rigid than that of resin insulation layers is prepared. A through hole is formed through core upper and lower surfaces of the insulation core, and a through hole conductor is formed therein. A plate-like substrate is prepared, and resin insulation layers and at least one conductor layer are laminated on the substrate to form a first buildup layer. The insulation core is laminated on the first buildup layer so as to electrically connect the conductor layer and the through hole conductor. Resin insulation layers and at least one conductor layer are then laminated on the insulation core. Lastly, the substrate is separated from the first buildup layer to yield a multilayer wiring substrate.

4 Claims, 4 Drawing Sheets

METHOD FOR MANUFACTURING MULTILAYER WIRING SUBSTRATE

CROSS REFERENCE TO RELATED APPLICATIONS

The present application claims priority from Japanese Patent Application No. 2011-30286, which was filed on Feb. 15, 2011, and Japanese Patent Application No. 2011-263275, which was filed on Dec. 1, 2011, the disclosure of which are herein incorporated by reference in its entirety.

BACKGROUND OF THE INVENTION

1. Field of the Invention

The present invention relates to a method for manufacturing a multilayer wiring substrate having a structure in which a plurality of resin insulation layers and at least one conductor layer are laminated alternately on upper and lower surfaces of an insulation core in a multilayer arrangement.

2. Description of Related Art

In association with recent increasing trends toward higher operation speeds and higher functionality of semiconductor integrated circuit devices (e.g., IC chips) used as, for example, microprocessors of computers, the number of terminals have increased and the pitch between the terminals generally has become narrower. Generally, a large number of terminals are densely arrayed on the bottom surface of an IC chip and are flip-chip-bonded to terminals provided on a motherboard. However, since the terminals of the IC chip differ greatly in pitch from those of the motherboard, difficulty is encountered in bonding the IC chip directly onto the motherboard. Thus, according to an ordinarily employed method, a semiconductor package configured such that the IC chip is mounted on an IC chip mounting wiring substrate is fabricated, and the semiconductor package is mounted on the motherboard.

The IC chip mounting wiring substrate which partially constitutes such a semiconductor package has been put into practice in the form of a multilayer wiring substrate configured such that buildup layers are formed on the front and back surfaces of a substrate core. See, for example, Japanese Patent Application No. 2010-153839. The substrate core used in the multilayer wiring substrate is, for example, a resin substrate (e.g., glass epoxy substrate) formed by impregnating reinforcement fiber with a resin. By utilizing a rigid substrate core, resin insulation layers and conductor layers are laminated alternately on the front and back surfaces of the substrate core, thereby forming respective buildup layers. In the multilayer wiring substrate, the substrate core serves as a reinforcement and is formed very thick compared to the buildup layers. Specifically, the substrate core is formed to have a thickness of, for example, about 400 µm. Also, the substrate core has through-hole conductors penetrating therethrough for electrical communication between the buildup layers formed on the front and back surfaces.

In recent years, in association with the implementation of high operation speeds of semiconductor integrated circuit devices, signal frequencies have become those of a high frequency band. In cases where such high signal frequencies are used, when the length of through-hole conductors penetrating through a substrate core increases, the through-hole conductors serve as sources of high inductance. This leads to transmission loss of high-frequency signals and circuitry malfunction, which hinders the implementation of high operation speeds.

BRIEF SUMMARY OF THE INVENTION

In order to solve the above-discussed problems, a multilayer wiring substrate having a thinner substrate core than that of a conventional substrate core is proposed. When a substrate core becomes thin, it is difficult to make the substrate core sufficiently rigid during a manufacturing process. Thus, warpage or distortion of a wiring substrate tends to occur when a buildup layer is formed on the substrate core. Traditionally, in order to avoid such warpage and distortion, exclusive manufacturing equipment, such as a supporting tool, was required, which causes increases in manufacturing costs of wiring substrates.

The present invention has been conceived in view of the above problems, and an object of the invention is to provide a method for manufacturing a highly reliable multilayer wiring substrate at lower cost without any warpage or distortion thereof.

A means (Aspect 1) for solving the above-mentioned problems is to provide a method for manufacturing a multilayer wiring substrate having a first buildup layer and a second buildup layer, which both include a plurality of resin insulation layers and at least one conductor layer laminated alternately in a multilayer arrangement, on a core upper surface and a core lower surface of an insulation core (collectively a laminated structure body), the method comprising steps of:

preparing the insulation core with an insulation material that is more rigid than a material of the resin insulation layers;

forming a through hole that extends through the core upper surface and the core lower surface;

preparing a substrate that is plate-like;

laminating the resin insulation layers and the conductor layer on the substrate to form the first buildup layer (a first buildup step);

a core bonding step of bonding the insulation core to the first buildup layer;

laminating the resin insulation layers and the conductor layer on the insulation core to form the second buildup layer (a second buildup step) after the core bonding step; and removing the substrate from the first buildup layer to separate the substrate from the first buildup layer, the insulation core, and the second buildup layer after the second buildup step.

According to Aspect 1 of the invention, the through hole is formed in the insulation core in the through hole formation step, which is separate from the buildup steps. The core bonding step is conducted between the first buildup step and the second buildup step. In this case, since the insulation core is securely supported by the substrate and is laminated, distortion or warpage of the multilayer wiring substrate can be reduced or fully prevented even if the employed insulation core thinner than a conventional core. Further, in the multilayer wiring substrate according to embodiments of the present invention, since the length of the through hole conductor is reduced due to the employment of the thin insulation core, transmission loss of high-frequency signals and circuit malfunction can be reduced or prevented. Furthermore, since the method for manufacturing the multilayer wiring substrate can use manufacturing equipment for a coreless wiring substrate without an insulation core, new manufacturing equipment, tools, or the like are not necessary. Moreover, the laminated structure body can be formed on both main and back surfaces of the substrate through the first buildup step, the core bonding step, and the second buildup step. Therefore, according to the manufacturing method of embodiments of the present invention, since two sheets of multilayer wiring substrates can be formed simultaneously, manufacturing efficiency of the multilayer wiring substrate can be enhanced. Further, since the through hole is formed in the insulation core in a separate step from the buildup steps, product yield can be improved.

In the method of manufacturing the multilayer wiring substrates according to Aspect 1 of the invention, the method may further comprise forming a core conductor formation step of forming a core conductor portion having a through hole conductor in the through hole (i.e., forming a through hole conductor in the through hole) after the through hole formation step and before the core bonding step. Also, in the core bonding step, the insulation core in which the core conductor portion (through hole conductor) is formed may be bonded to the first buildup layer to establish an electrical connection between the conductor layer of the first buildup layer and the through hole conductor.

In the method for manufacturing the multilayer wiring substrate according to Aspect 1, the method may further comprise a core lamination step of laminating the resin insulation layers and the conductor layers on the core upper surface and the core lower surface of the insulation core to form, respectively, a third buildup layer and a fourth buildup layer. The core lamination step may occur after the through hole conductor formation step and before the core bonding step. Then, the core bonding step includes bonding the third buildup layer to the first buildup layer, and the second buildup step includes forming the second buildup layer on the fourth buildup layer. In this way, distortion or warpage of the multilayer wiring substrate can be reduced or prevented.

Moreover, a plurality of insulation cores having resin insulation layers and conductor layers may be laminated together in order to produce the multilayer wiring substrate. In this way, the intensity of the multilayer wiring substrate is fully secured using the plural insulation cores. In addition, the insulation cores preferably have a thickness of 100 micrometers or more in order to provide rigidity to the multilayer wiring substrate.

A suitable material for the insulation core formed in the core preparation step is preferably an insulation material formed by impregnating glass woven fabric or glass nonwoven fabric with resin. The material may be selected by considering its cost, machinability, insulation properties, mechanical strength, or the like. The insulation core may be an insulation material made of ceramic or metal. Specific examples of the ceramic insulation core include substrates made of low-temperature firing materials, such as an alumina board, a beryllia board, a glass ceramic board, and a crystallized glass. Specific examples of the metal insulation core include a copper board, a copper alloy board, an insulation material made of single metal substance other than copper, and an insulation material made of an alloy other than copper alloy.

In the core conductor formation step, the through hole may be formed in the insulation core through drilling or a laser process. Particularly, the through hole whose opening diameter is the same at the core upper surface and the core lower surface may be formed through drilling. In this case, the through holes may be accurately formed with a relatively narrow pitch. This facilitates a high density wiring pattern of the conductor layer connected to the through hole conductor.

In the core bonding step, an electrical connection between the conductor layer of the first buildup layer and the through hole conductor is preferably established with a conductive adhesive. In this way, the connection reliability of the conductor layer and the through hole conductor in the multilayer wiring substrate may be improved. Further, the insulation core is preferably disposed in the center of the laminated structure body. In this way, warpage of the multilayer wiring substrate may be reduced or securely prevented.

In the buildup step, via conductors for connecting the conductor layers on the main surface side and back surface side are formed in the resin insulation layer. The through hole conductors of the insulation core is preferably disposed right above the via conductors.

A material for a plurality of resin insulation layers partially forming the multilayer wiring substrate can be selected as appropriate in consideration of, for example, electrical insulation performance, heat resistance, and humidity resistance. Examples of preferred polymer materials employed for forming the resin insulation layers include thermosetting resins such as epoxy resin, phenolic resin, urethane resin, silicone resin, and polyimide resin; and thermoplastic resins such as polycarbonate resin, acrylic resin, polyacetal resin, and polypropylene resin.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Figure 1:
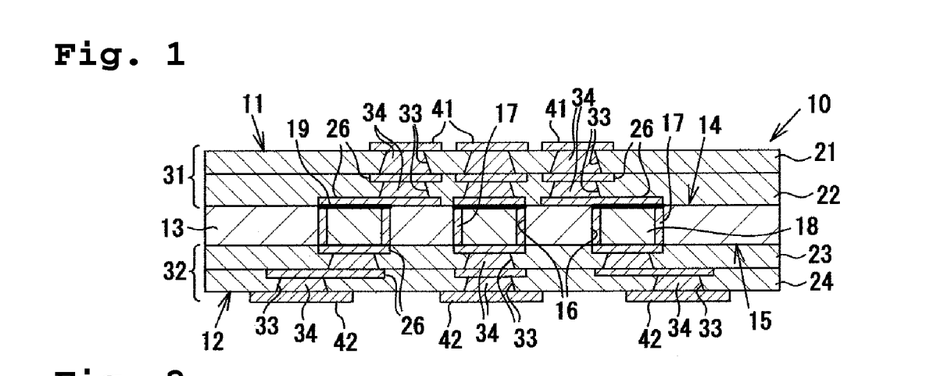
FIG. 1 is a cross-sectional view showing the configuration of a multilayer wiring substrate according to an embodiment of the present invention.

An embodiment of the present invention will next be described in detail with reference to the drawings. FIG. 1 is an enlarged cross-sectional view showing the configuration of a multilayer wiring substrate 10 of the present embodiment.

As shown in FIG. 1, the multilayer wiring substrate 10 according to the present embodiment is an IC chip mounting wiring substrate, and has a main surface 11 and a back surface 12 opposite the main surface 11. Specifically, the multilayer wiring substrate 10 includes a thin plate-like insulation core 13, a first buildup layer 31 (multilayer structure) formed on a core upper surface 14 (in FIG. 1) of the insulation core 13, and a second buildup layer 32 (multi-layer structure) formed on a core lower surface 15 (in FIG. 1) of the insulation core 13.

In the present embodiment, the first buildup layer 31 has a structure in which two resin insulation layers 21 and 22 made of a thermosetting resin (e.g., epoxy resin) and conductor layers 26 made of copper are laminated alternately. Similar to the case of the first buildup layer 31, the second buildup layer 32 has a structure in which two resin insulation layers 23 and 24 made of a thermosetting resin (e.g., epoxy resin) and conductor layers 26 made of copper are laminated alternately. Each of the resin insulation layers 21-24 forming the buildup layers 31, 32 has a thickness of, for example, about 35 µm, and each of the conductor layers 26 has a thickness of, for example, about 15 µm.

In the multilayer wiring substrate 10, a plurality of IC-chip connection terminals 41, to which an IC chip is to be connected, are arrayed on one side of the first buildup layer 31 toward the main surface 11. Meanwhile, a plurality of motherboard connection terminals 42, to which a motherboard is to be connected, are arrayed on one side of the second buildup layer 32 toward the back surface 12. The motherboard connection terminals 42 are greater in area than the IC-chip connection terminals 41 provided on the main surface 11 side.

The insulation core 13 is provided as a center layer of the multilayer wiring substrate 10 including the buildup layers 31, 32 formed of a plurality of resin insulation layers 21-24 and a plurality of conductor layers 26. The insulation core 13 may have a thickness of 400 µm or less, such as about 200 µm in the present embodiment, and is made of an insulation material having larger rigidity than that of the resin insulation layers 21-24. More particularly, the insulation core 13 of the present embodiment is made of, for example, a resin insulation material (e.g., glass epoxy material) formed by impregnating glass cloth (i.e., a reinforcing material) with an epoxy resin.

The insulation core 13 has a plurality of through holes 16 extending from the core upper surface 14 to the core lower surface 15. A through hole conductor 17 (core conductor portion) is formed on an inner wall of each through hole 16, and a plugging body 18 made of, for example, epoxy resin is filled inside the through hole conductors 17. In this embodiment, a through hole 16 has the same opening diameter at the core upper surface 14 and at the core lower surface 15. Moreover, the through hole conductor 17 electrically connects the core upper surface 14 (conductor layer 26 of the first buildup layer 31) and the core lower surface 15 (conductor layer 26 of the second buildup layer 32). In addition, the conductor layer 26 on the core upper surface 14 side and the through hole conductor 17 are electrically connected through a conductive adhesive 19.

Via holes 33 and filled-via conductors 34 are provided in the resin insulation layers 21-24 forming the first buildup layer 31 and the second buildup layer 32. Each of the via holes 33 and via conductors 34 provided in the resin insulation layers 21-24 has a tapered shape such that the diameter thereof increases from the main surface 11 side to the back surface 12 side of the substrate.

The via conductors 34 formed in the resin insulation layers 21-24 and the through hole conductors 17 formed in the insulation core 13 electrically interconnect the conductor layers 26, IC-chip connection terminals 41, and motherboard connection terminals 42.

The multilayer wiring substrate 10 having the aforementioned configuration is fabricated through, for example, the following procedure.

First, the plate-like insulation core 13 made of the insulation material (e.g., glass epoxy material) having a thickness of 200 µm or less and being more rigid than the resin insulation layers 21-24 is prepared (core preparation step).

Figure 2:
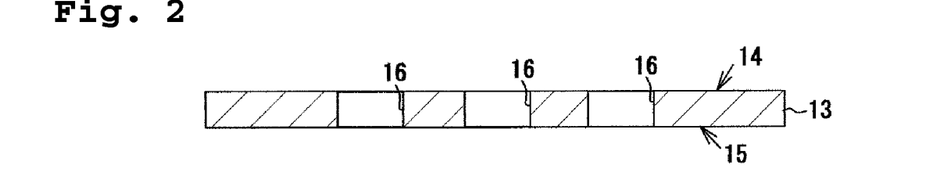
FIG. 2 is an explanatory view of a method of manufacturing the multilayer wiring substrate according to an embodiment of the present invention.

Thereafter, as shown in FIG. 2, drilling is performed on the insulation core 13 to thereby form the through holes 16 which are open at both the core upper surface 14 and the core lower surface 15 of the insulation core 13 (through-hole formation step). Then, electroless copper plating is carried out for forming a plating layer (unillustrated) so as to cover the entire core upper surface 14 and the core lower surface 15 and the inner wall of the through holes 16.

Figure 3:
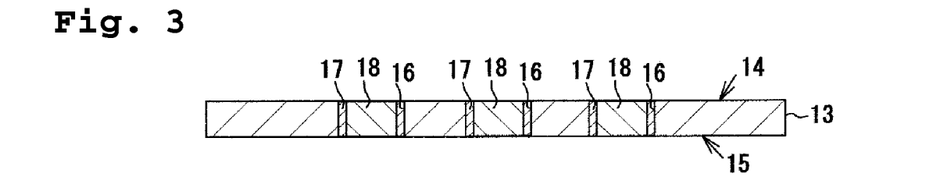
FIG. 3 is an explanatory view of a method of manufacturing the multilayer wiring substrate according to an embodiment of the present invention.

Then, a dry film for plating resist formation is laminated on the core upper surface 14 and the core lower surface 15, and the dry film is subjected to exposure and development. Thus, a plating resist layer having a specific pattern in which openings are arranged at positions corresponding to the through holes 16 is formed on the core upper surface 14 and the core lower surface 15. Thereafter, copper electroplating is selectively carried out on the insulation core having the plating resist layer formed thereon to thereby form the through hole conductor 17 on each inner wall of the through holes 16 (core conductor formation step). After removal of the plating resist layer from the core upper surface 14 and the core lower surface 15, etching is carried out, to thereby remove the unillustrated plating layer. Further, an insulating resin material (e.g., epoxy resin) is filled inside of the through hole 16 on which the through hole conductor 17 is formed to thereby form the plugging body 18 (see FIG. 3).

Figure 4:
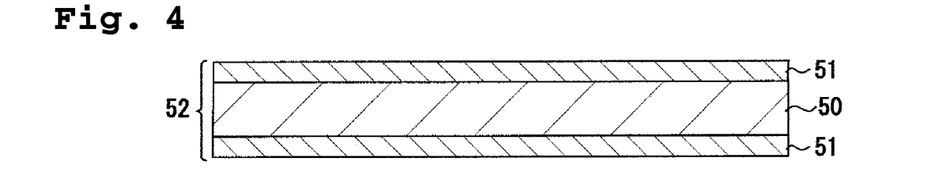
FIG. 4 is an explanatory view of a method of manufacturing the multilayer wiring substrate according to an embodiment of the present invention.
Figure 5:
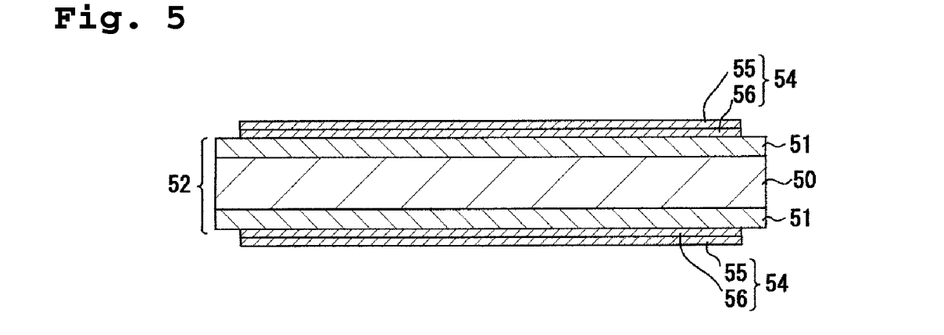
FIG. 5 is an explanatory view of a method of manufacturing the multilayer wiring substrate according to an embodiment of the present invention.

Next, a supporting substrate 50 (e.g., glass epoxy substrate or the like) having sufficient rigidity is prepared. As shown in FIG. 4, a sheet-like insulating resin substrate made of epoxy resin is laminated on the surfaces (on the upper and lower surfaces in FIG. 4) of the supporting substrate 50 (supporting board) to form a base resin insulation layers 51. Thus, a plate-like substrate 52 constituted by the supporting substrate 50 (supporting board) and the base resin insulation layers 51 is produced. Thereafter, as shown in FIG. 5, a laminated metal sheet layer 54 is disposed on each surface of the base resin insulation layers 51 of the substrate 52. In this way, a certain adhesion between the laminated metal sheet layer 54 and the base resin insulation layer 51 is ensured to the extent that they are not separated in the subsequent manufacturing processes. The laminated metal sheet layer 54 is formed from copper foils 55 and 56 adhering to each other in a detachable manner. More particularly, the copper foils 55 and 56 are laminated through metal plating (e.g., chrome plating, nickel plating, titanium plating, or these composite plating) to form the laminated metal sheet layer 54.

Figure 6:
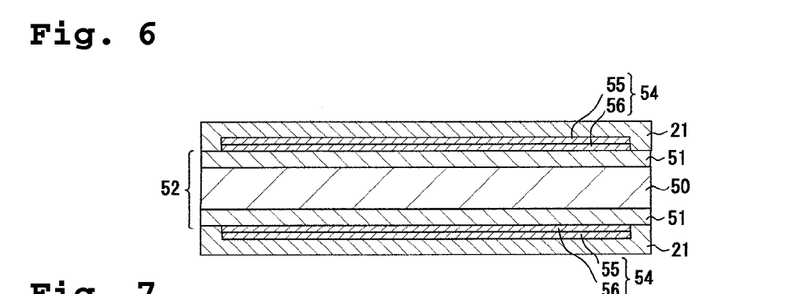
FIG. 6 is an explanatory view of a method of manufacturing the multilayer wiring substrate according to an embodiment of the present invention.

As shown in FIG. 6, the sheet-like resin insulation layer 21 is laminated so as to cover the laminated metal sheet layer 54. Here, the resin insulation layer 21 is laminated with the laminated metal sheet layer 54 and also laminated with the base resin insulation layer 51 at a peripheral region of the laminated metal sheet layer 54, whereby the laminated metal sheet layer 54 is sealed.

Figure 7:
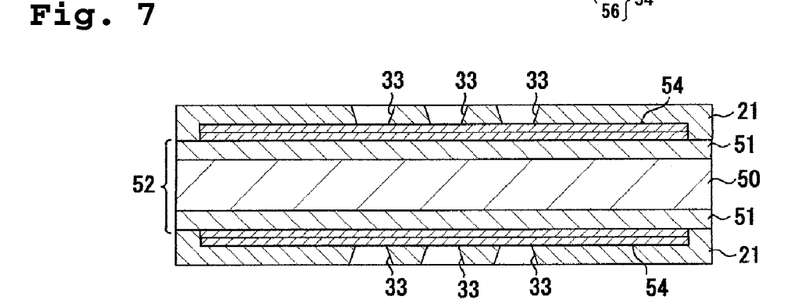
FIG. 7 is an explanatory view of a method of manufacturing the multilayer wiring substrate according to an embodiment of the present invention.

As shown in FIG. 7, by means of, for example, an excimer laser, a UV laser, or a $CO_2$ laser, via holes are formed in predetermined positions of the resin insulation layer 21. Subsequently, by use of an etchant such as a potassium permanganate solution, a desmear step is carried out for removing smears from inside the via holes 33. In the desmear step, instead of using an etchant, plasma ashing by means of, for example, $O_2$ plasma may be performed.

Figure 8:
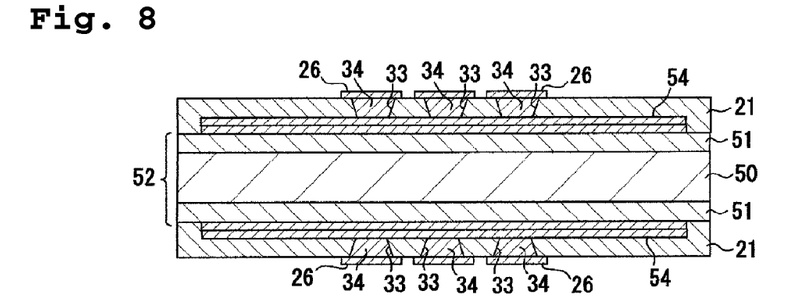
FIG. 8 is an explanatory view for explaining a method of manufacturing the multilayer wiring substrate according to an embodiment of the present invention.

After the desmear step, electroless copper plating and copper electroplating are carried out in a conventionally known manner, to thereby form the via conductors 34 in the via holes 33. Further, through performing etching by a conventionally known technique (e.g., semi-additive method), the conductor layers 26 are patterned on the resin insulation layers 21 (see FIG. 8).

Figure 9:
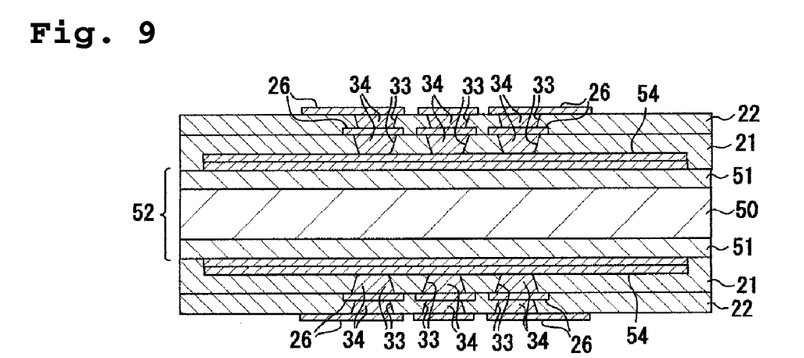
FIG. 9 is an explanatory view of a method of manufacturing the multilayer wiring substrate according to an embodiment of the present invention.

Moreover, resin insulation layers 22 and further conductor layers 26 are formed on the resin insulation layers 21 in a manner similar to that of the aforementioned resin insulation layers 21 and conductor layers 26. Thus, through this first buildup step, the resin insulation layers 21, 22 and the conductor layers 26 are formed on the copper foil 55 of the laminated metal sheet layer 54 (see FIG. 9).

Then, the insulation core 13 is bonded to the resin insulation layer 22 and the conductor layer 26 (core bonding step). At this time, the conductive adhesive 19 is applied so as to cover an opening of the through hole 16 at the core upper surface 14 of the insulation core 13 so that the conductor layers 26 and the through hole conductor 17 are electrically connected through the conductive adhesive 19 (refer to FIG. 10). The through hole conductor 17 may be disposed right above the via conductor 34, or disposed in a shifted position from the via conductor 34. However, it is preferable that the through hole conductor 17 be disposed right above the via conductor 34 or a vicinity thereof. Further, the core bonding step can be carried out when the insulation core 13 is completely hardened or in a semi-hardened state.

Figure 10:
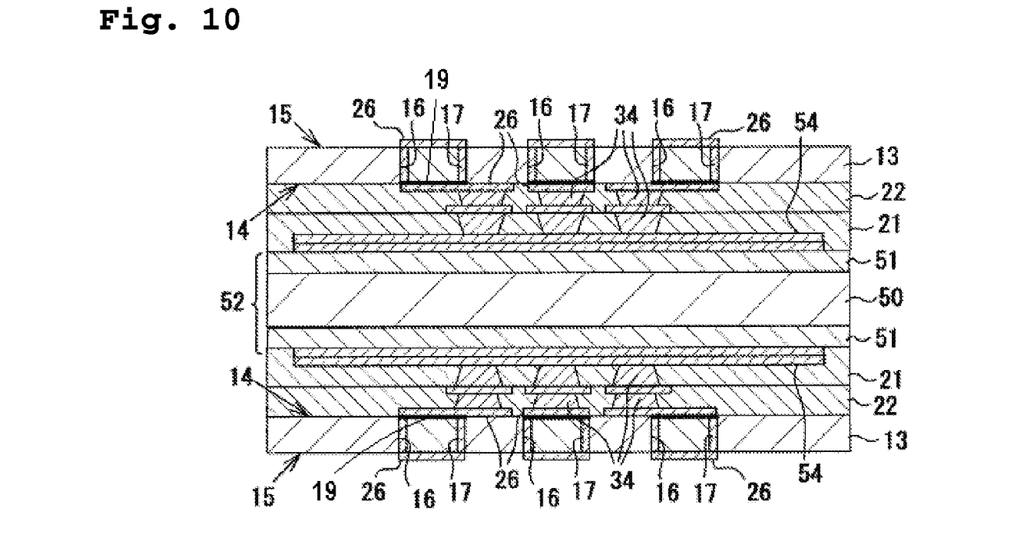
FIG. 10 is an explanatory view of a method of manufacturing the multilayer wiring substrate according to an embodiment of the present invention.

Further, the conductor layer 26 is patterned on the core lower surface 15 by, for example, a semi-additive method (refer to FIG. 10). In addition, this conductor layer 26 may be formed on the core lower surface 15 prior to the core bonding step. Furthermore, before the core bonding step, the conductor layer 26 may be formed on the core upper surface 14 and laminated on the conductor layer 26 on the resin insulation layer 22 through the conductive adhesive 19 so that the conductor layer 26 may be electrically connected to the through hole conductor 17.

Figure 11:
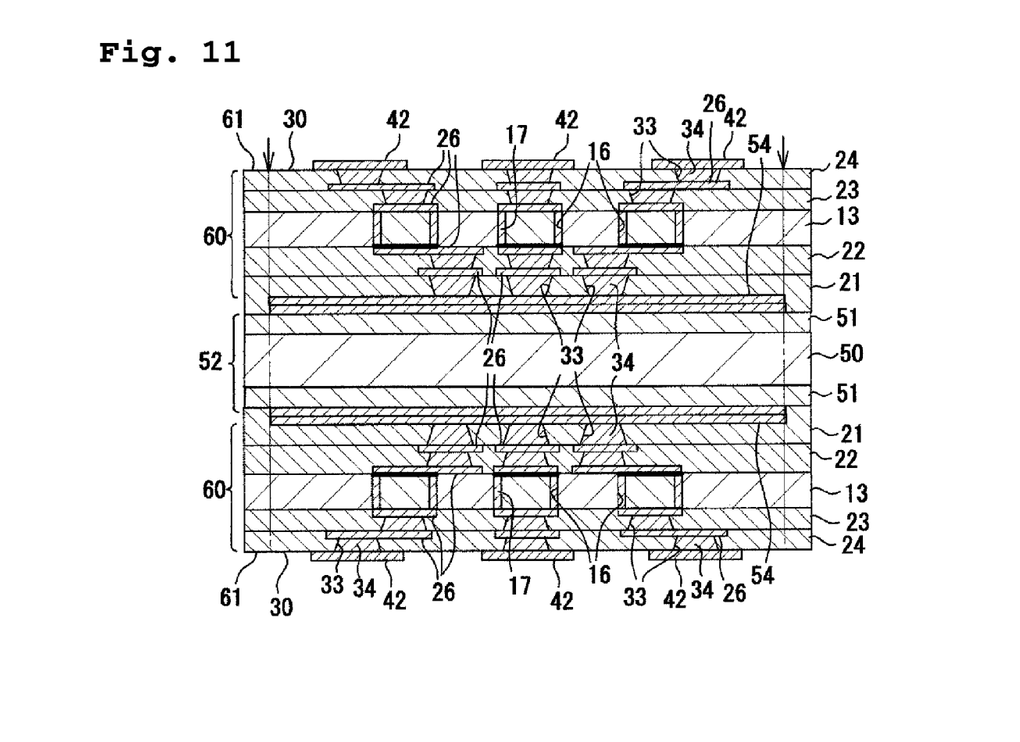
FIG. 11 is an explanatory view of a method of manufacturing the multilayer wiring substrate according to an embodiment of the present invention.

As shown in FIG. 11 after the core bonding step, the resin insulation layers 23, 24 and conductor layers 26 are formed on the insulation core 13 in a manner (second buildup step) similar to that used for the resin insulation layers 21, 22 and the conductor layer 26. The motherboard connection terminals 42 are formed on the outermost resin insulation layer 24. In this way, wiring multilayered bodies 60 comprising the laminated metal sheet layers 54, the resin insulation layers 21-24, the insulation core 13, and the conductor layers 26 are formed on the substrate 52 (refer to FIG. 11). In addition, in the wiring multilayered bodies 60, the areas on the laminated metal sheet layers 54 serve as wiring laminated portions 30 (buildup layers 31, 32) of the multilayer wiring substrate 10.

Then, the wiring multilayered bodies 60 are sectioned by a dicing apparatus (not illustrated) to remove peripheral regions of the wiring laminated portions 30. At this time, as shown in FIG. 11, the substrate 52, comprising the supporting substrate 50 and the base resin insulation layer 51, is sectioned along a boundary (shown with arrows in FIG. 11) of the wiring laminated portion 30 and peripheral portions 61 of the wiring laminated portions 30. In this way, an outer edge portion of the laminated metal sheet layer 54 sealed by the resin insulation layer 21 is exposed. That is, by removing the peripheral portions 61, the bonded portion between the base resin insulation layer 51 and the resin insulation layer 21 is removed. As a result, the wiring laminated portions 30 are connected with the substrate 52 through only the laminated metal sheet layer 54.

Figure 12:
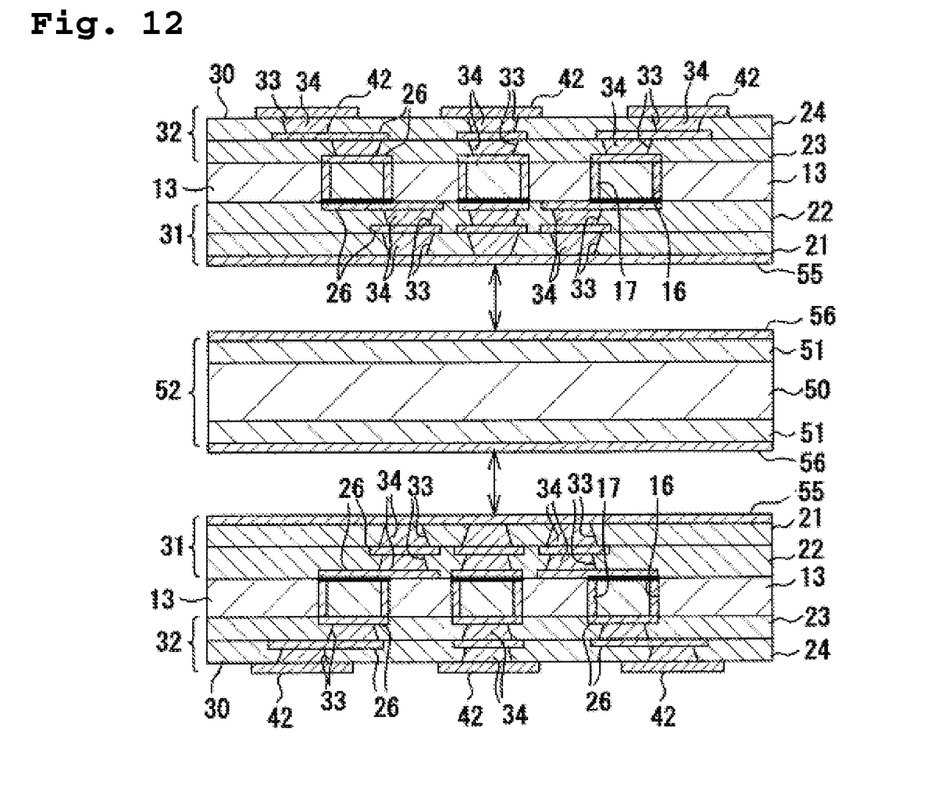
FIG. 12 is an explanatory view of a method of manufacturing the multilayer wiring substrate according to an embodiment of the present invention.

As shown in FIG. 12, the substrate 52 is separated from the wiring laminated portion 30 at an interface between the copper foils 55 and 56 of the laminated metal sheet layer 54 so that the copper foil 55 on the surface of the first buildup layer 31 (resin insulation layer 21) is exposed (substrate removal step). Then, the copper foil 55 in the wiring laminated portion 30 is patterned with a subtractive method. More particularly, a dry film is laminated on upper and lower surfaces of the wiring laminated portion 30, and is subjected to exposure and development. In this way, etching resist is formed on the entire surface of the second buildup layer 32 as well as on the first buildup layer 31 with a predetermined pattern that corresponds to the IC-chip connection terminals 41. In this state, the copper foil 55 of the wiring laminated portion 30 is pattern etched to form the IC-chip connection terminals 41 on the resin insulation layer 21. Thereafter, the etching resist is exfoliated from the surface of each buildup layer 31, 32. Finally, the multilayer wiring substrate 10 of FIG. 1 is manufactured.

Therefore, the present embodiment can yield at least the following effects.

(1) According to this embodiment, the through hole 16 is formed in the insulation core 13 in the through hole formation step which is a separate step from the buildup step, and the core conductor portion including the through hole conductor 17 is formed in the insulation core 13 in the core conductor formation step. Further, the core bonding step is conducted between the first and second buildup steps in which the resin insulation layers 21-24 and the conductor layers 26 are laminated on the plate-like substrate 52. As a result, the insulation core 13 is bonded to the resin insulation layer 22 and the conductor layer 26, and the conductor layer 26 and the through hole conductor 17 are electrically connected. In this case, since the insulation core 13 securely supported by the substrate 52 is laminated, any distortion or warpage of the multilayer wiring substrate 10 can be reduced or fully prevented even if an insulation core 13 being 400 micrometers or less in thickness, which is thinner than a conventional core, is employed. Furthermore, in the multilayer wiring substrate 10, since the length of the through hole conductor 17 is reduced because of the insulation core 13 being thin, transmission loss of high-frequency signals and circuit malfunction can be reduced or prevented.

(2) In the manufacturing method of the present embodiment, since the multilayer wiring substrate 10 can be manufactured using manufacturing equipment for a coreless wiring substrate, which does not have a insulation core 13, new manufacturing equipment, tools or the like are not necessary. Further, the wiring laminated portion 30 can be formed on the main and back surfaces of the substrate 52 through the first buildup step, the core bonding step, and the second buildup step. Therefore, according to the manufacturing method of the present embodiment, since two sheets of multilayer wiring substrates 10 can be formed simultaneously, manufacturing efficiency of the multilayer wiring substrate 10 can be enhanced. Furthermore, since the through hole 16 and the through hole conductor 17 are formed in the insulation core 13 in a separate step from the buildup step, product yield can be improved.

(3) According to the present embodiment, the through hole 16 whose opening diameter is the same at the core upper surface 14 and the core lower surface 15 can be formed by drilling through the insulation core 13. In this case, the through holes 16 can be accurately formed with a relatively narrow pitch. This facilitates having a high density wiring pattern of the conductor layer 26 connected to the through hole conductor 17.

(4) In the multilayer wiring substrate 10 of the present embodiment, the conductor layer 26 is electrically connected to the through hole conductor 17 through the conductive adhesive 19. In this way, the connection reliability of the conductor layer 26 and the through hole conductor 17 in the multilayer wiring substrate 10 can be improved.

(5) In the multilayer wiring substrate 10 of the present embodiment, since the insulation core 13 is disposed in the center of the plurality of resin insulation layers 21-24 and the plurality of conductor layers 26 which constitute the buildup layers 31, 32, warpage of the multilayer wiring substrate 10 can be reduced or securely prevented.

The embodiment of the present invention may be modified at least as follows.

Figure 13:
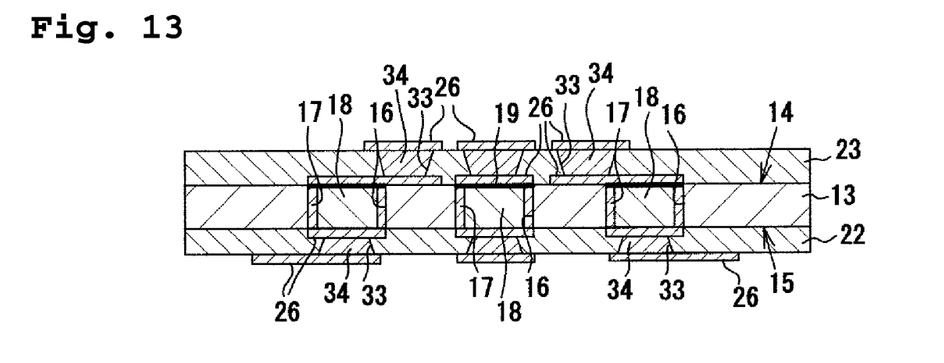
FIG. 13 is an explanatory view of a method of manufacturing the multilayer wiring substrate according to another embodiment of the present invention that comprises a core lamination step.

According to the aforementioned embodiment, the core bonding step is conducted after forming the through hole 16 in the insulation core 13 in the through hole formation step and after forming the through hole conductor 17 in the insulation core 13 in the core conductor formation step. However, the present invention is not limited thereto. More particularly, the core lamination step may be conducted after the core conductor formation step, and the resin insulation layers 22, 23 (respectively referred to hereinafter as a "third resin insulation layer" and a "second resin insulation layer") and the conductor layer 26 may then be laminated on the core upper surface 14 and the core lower surface 15, as shown in FIG. 13.

Then, the insulation core 13 having the resin insulation layers 22, 23 (the "third resin insulation layer" and the "second resin insulation layer") and the conductor layers 26 is bonded to the resin insulation layer 21 (referred to hereinafter as a "first resin insulation layer") and the conductor layer 26 formed in the first buildup step by bonding the third resin insulation layer 22 to the first resin insulation layer 21. Then, the second buildup step and the substrate removal step may be conducted by laminating a fourth resin insulation layer (e.g., resin insulation layer 24) to the second resin insulation layer 23 to complete the multilayer wiring substrate 10. In this way, any distortion or warpage of the multilayer wiring substrate 10 can be reduced or prevented.

According to the aforementioned embodiment, the core conductor formation step forming the through hole conductor 17 in the through hole 16 is conducted after the through hole formation step and before the core bonding step. However, the present invention is not limited thereto. For example, core conductor portions (e.g., a conductor pattern and a land or the like which are arranged on the core upper surface 14 and the core lower surface 15) other than the through hole conductor 17 may be formed in addition to forming the through hole conductor 17 in the core conductor formation step. According to the aforementioned embodiment, the core conductor formation step is conducted after the through hole formation step and before the core bonding step, but it can also be conducted at a different time (e.g., after the core bonding step and before the second buildup step). More particularly, the insulation core 13 in which the core conductor portion is not yet formed may be bonded to the resin insulation layer 22 and the conductor layer 26 which are formed on the substrate in the core bonding step. Then, the through hole conductor 17 is formed in the through hole 16 of the insulation core 13 so as to establish electrical connection with the conductor layer 26.

According to the aforementioned embodiment, there is a core conductor formation step, but the core conductor formation step can be omitted if it is not necessary.

According to the aforementioned embodiment, the core bonding step which establishes the electrical connection between the conductor layer 26 and the through hole conductor 17 is described. However, the present invention is not limited to this description. For example, in the core bonding step, the insulation core 13 may be only bonded to the resin insulation layer 22 and the conductor layer 26 which are formed on the substrate without establishing an electrical connection between the conductor layer 26 and the through hole conductor 17.

Although the multilayer wiring substrate 10 of the above embodiment only has the single insulation core 13, a plurality of insulation cores 13 may be used in the multilayer wiring substrate 10. For example, the core bonding step may be repeated 2 or more times in the buildup step so that a plurality of insulation cores 13, each of which includes the resin insulation layers 22, 23 and the conductor layers 26 (refer to FIG. 13), are laminated together in order to produce the multilayer wiring substrate 10. Thus, the intensity of the multilayer wiring substrate 10 is secured using the plural insulation cores 13.

In the above embodiment, although the through hole 16 is formed by drilling the insulation core 13, it may be formed by laser process.

According to the aforementioned embodiment, although the through hole conductor 17 of the insulation core 13 is formed by copper plating, it may be formed by filling a metal material into the through hole 16 by, for example, printing. Furthermore, the through hole conductor 17 may be formed by inserting a cylindrical metal material into the through hole 16.

Although the resin insulation layers 21-24, the insulation core 13, and the conductor layers 26 are laminated from the main surface 11 side of the substrate where the IC-chip connection terminals 41 are to be formed, they may be laminated on the back surface 12 side of the substrate where the motherboard connection terminals 42 are to be formed. In this case, the plural conductor layers 26 formed on the plural resin insulation layers 21-24 are connected through the via conductor 34 whose diameter increases towards the main surface 11 from the back surface 12 side of the substrate.

The following is a non-limiting list of the technical ideas that the embodiment described above may implement.

(1) The method for manufacturing the multilayer wiring substrate according to Aspect 1, in which the through hole having the same diameter at the upper and lower surfaces of the core substrate is formed in the insulation core by drilling in the through hole formation step.

(2) The method for manufacturing the multilayer wiring substrate according to Aspect 1, further including a core lamination step in which the resin insulation layers and the conductor layers are laminated on the upper and lower surfaces of the insulation core after the through hole formation step. A plurality of insulation cores each having the resin insulation layer and the conductor layer is laminated on the resin insulation layer and the conductor layer formed in the first buildup step through conducting the core bonding step after the core lamination step.

(3) The method for manufacturing the multilayer wiring substrate according to Aspect 1, wherein the insulation core is disposed in the center of the laminated structure body.

(4) The method for manufacturing the multilayer wiring substrate according to the Aspect 1, wherein the resin insulation layer has a via conductor for connecting the conductor layer on the upper surface with the conductor layer on the back surface, and the through hole conductor of the insulation core is disposed right above the via conductor.

(5) The method for manufacturing the multilayer wiring substrate according to Aspect 1, wherein the plate-like insulation core has a thickness of 100 micrometers or more.

DESCRIPTION OF REFERENCE NUMERALS

10: multilayer wiring substrate
13: insulation core
14: core upper surface serving as a surface of insulation core
15: core lower surface serving as a surface of insulation core
16: through-hole
17: through-hole conductor
19: conductive adhesive
21-24: resin insulation layer
26: conductor layer

What is claimed is:

1. A method for manufacturing a multilayer wiring substrate having a plurality of resin insulation layers and a plurality of conductor layers laminated alternately in multilayer arrangement on a core upper surface and a core lower surface of an insulation core, the method comprising the steps of:
   providing the insulation core, the insulation core comprising an insulation material that is more rigid than a material of the resin insulation layers;
   a through hole formation step of forming a through hole that extends through the core upper surface and the core lower surface;
   providing a substrate that is plate-like;
   a first buildup step of laminating at least one resin insulation layers and at least one conductor layer on the substrate to form a first buildup layer;
   a core lamination step, occurring after the through hole formation step, of laminating at least one resin insulation layer and at least one conductor layer on the core lower surface to form a second buildup layer, and of laminating at least one resin insulation layer and at least one conductor layer on the core upper surface to form a third buildup layer;
   a core bonding step of bonding the third buildup layer on the insulation core to the first buildup layer after the core lamination step and the first buildup step;
   a second buildup step of laminating at least one resin insulation layer and at least one conductor layer on the second buildup layer to form a fourth buildup layer after the core bonding step; and
   removing the substrate from the first buildup layer to separate the substrate from the first buildup layer, the second buildup layer, the third buildup layer, the fourth buildup layer, and the insulation core after the second buildup step.

2. The method for manufacturing a multilayer wiring substrate according to claim 1, further comprising:
   forming a through hole conductor in the through hole after the through hole formation step and before the core bonding step,
   wherein, in the core lamination step, the insulation core in which the through hole conductor is formed is bonded to the second buildup layer and the third buildup layer to establish an electrical connection between the conductor layer of the second buildup layer, the through hole conductor, and the conductor layer of the third buildup layer.

3. The method for manufacturing a multilayer wiring substrate according to claim 1, wherein the insulation material is formed by impregnating glass woven fabric or glass non-woven fabric with resin.

4. A method for manufacturing a multilayer wiring substrate having resin insulation layers and conductor layers laminated in multilayer arrangement on an insulation core, the method comprising steps of:
   providing a substrate that is plate-like;
   a first buildup step of laminating a first resin insulation layer and at least one conductor layer on the substrate;
   providing the insulation core, the insulation core comprising an insulation material that is more rigid than a material of the resin insulation layers;
   a through hole formation step of forming a through hole that extends through a core upper surface and a core lower surface;
   forming a through hole conductor in the through hole after the through hole formation step;
   a core lamination step, occurring after the through hole formation step, of laminating a second resin insulation layer and at least one conductor layer on the core lower surface and laminating a third resin insulation layer and at least one conductor layer on the core upper surface;
   a core bonding step of bonding the third resin insulation layer to the first resin insulation layer after the core lamination step;
   a second buildup step of laminating a fourth resin insulation layer on the second resin insulation layer after the core bonding step; and
   removing the substrate from the first resin insulation layer to separate the substrate from the first resin insulation layer, the second resin insulation layer, the insulation core, the third resin insulation layer, the fourth resin insulation layer, and the conductor layers.

* * * * *

UNITED STATES PATENT AND TRADEMARK OFFICE
CERTIFICATE OF CORRECTION

PATENT NO.      : 8,580,066 B2
APPLICATION NO. : 13/372088
DATED           : November 12, 2013
INVENTOR(S)     : Yamada et al.

Page 1 of 1

It is certified that error appears in the above-identified patent and that said Letters Patent is hereby corrected as shown below:

IN THE CLAIMS:

Claim 1, col. 11, line 30 change the word "layers" to "layer"

Signed and Sealed this
Fourth Day of February, 2014

Michelle K. Lee
*Deputy Director of the United States Patent and Trademark Office*